(12) United States Patent
Jung

(10) Patent No.: US 7,572,687 B2
(45) Date of Patent: Aug. 11, 2009

(54) SEMICONDUCTOR DEVICE AND MANUFACTURING METHOD OF THE SAME

(75) Inventor: Ji Houn Jung, Jongno-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/170,475

(22) Filed: Jul. 10, 2008

(65) Prior Publication Data
US 2009/0014782 A1    Jan. 15, 2009

(30) Foreign Application Priority Data
Jul. 11, 2007    (KR) .................. 10-2007-0069508

(51) Int. Cl.
*H01L 21/00*    (2006.01)
(52) U.S. Cl. .............. 438/152; 438/149; 438/151; 438/155; 257/330
(58) Field of Classification Search .............. 438/149, 438/151, 152, 155; 257/330
See application file for complete search history.

(56) References Cited

U.S. PATENT DOCUMENTS 6,822,288 B2 * 11/2004 Hshieh et al. ............... 257/330
2003/0075760 A1 * 4/2003 Osawa ....................... 257/330

* cited by examiner

*Primary Examiner*—Thanh V Pham
*Assistant Examiner*—Marvin Payen
(74) *Attorney, Agent, or Firm*—Saliwanchik, Lloyd & Saliwanchik

(57) ABSTRACT

Disclosed is a semiconductor device. The semiconductor device includes a first gate formed in a trench of a semiconductor substrate, a first gate oxide layer on the semiconductor substrate including the first gate, a first epitaxial layer on the first gate oxide layer, first source and drain regions in the first epitaxial layer at sides of the first gate, an insulating layer on the first epitaxial layer, a second epitaxial layer on the insulating layer, a second gate oxide layer on the second epitaxial layer, a second gate on the second gate oxide layer, and second source and drain regions in the second epitaxial layer below sides of the second gate.

11 Claims, 6 Drawing Sheets

SEMICONDUCTOR DEVICE AND MANUFACTURING METHOD OF THE SAME

CROSS-REFERENCE TO RELATED APPLICATION

The present application claims the benefit of priority under 35 U.S.C. § 119(e) to Korean Patent Application No. 10-2007-0069508, filed Jul. 11, 2007, which is hereby incorporated by reference in its entirety.

BACKGROUND

As semiconductor devices become highly integrated, controlling performance of the semiconductor device becomes very difficult. For example, in the case of a MOS transistor, since sizes of a gate electrode, a source electrode, a drain electrode and the like are reduced, a channel length is also reduced. If the channel length is reduced as described above, SCE (short channel effect) and RSCE (reverse short channel effect) may occur. Thus, threshold voltage of the transistor may not be easily adjusted.

Further, since the driving voltage of a highly integrated semiconductor device is relatively high as compared with the size of the highly integrated semiconductor device, electrons emitted from a source may be excessively accelerated due to potential gradient of a drain. Thus, hot carriers may be generated around the drain. In this regard, an LDD (lightly doped drain) structure has been introduced in order to improve the performance of the semiconductor device having the structural weakness as described above.

According to the LDD structure, an n-LDD region positioned between a channel and source/drain attenuates drain-gate voltage around a drain junction and reduces excessive potential gradient, so that the hot carriers can be prevented from being generated. In order to obtain such an LDD structure, a technology of forming spacers at both sidewalls of a gate electrode has been introduced.

However, in the ion implantation process for forming the LDD region, defects may occur on a substrate and a semiconductor layer. Further, an ion implantation apparatus is generally expensive, has a complicated configuration, and may be difficult to operate. In addition, a manager of the apparatus may be exposed to poison gas and high voltage.

Further, in the case of integrating various devices such as PMOS transistors and NMOS transistors on the same wafer, formation of an n-type LDD pattern, n-type ion implantation, cleaning, formation of a p-type LDD pattern, p-type ion implantation, and cleaning must be repeatedly performed.

Furthermore, when the n-type LDD region is formed and a cleaning process is performed, an oxide layer of a polysilicon layer may be partially damaged. Thus, an oxidation process must be performed before p-type ions are implanted.

In addition, sidewalls are formed at the sides of the gate electrode in order to attenuate stress and enhance adhesion between the spacers and the electrode. Then, the spacers are formed through deposition, etch and cleaning processes.

As described above, the LDD technology requires a complicated procedure, so that process efficiency is degraded and the manufacturing time and cost may be increased.

BRIEF SUMMARY

Embodiments of the present invention provide a semiconductor device capable of inhibiting the hot carrier phenomenon efficiently controlling breakdown voltage, and stably forming a channel, and a manufacturing method of the same.

An embodiment provides a semiconductor device capable of increasing the integration degree of a device by modifying an arrangement structure on a plane, and a manufacturing method of the same.

Disclosed is a semiconductor device. The semiconductor device can include a first gate formed in a trench of a semiconductor substrate; a first gate oxide layer on the semiconductor substrate including the first gate; a first epitaxial layer on the first gate oxide layer; first source and drain regions in the first epitaxial layer at sides of the first gate; an insulating layer on the first epitaxial layer; a second epitaxial layer on the insulating layer; a second gate oxide layer on the second epitaxial layer; a second gate on the second gate oxide layer; and second source and drain regions in the epitaxial layer below sides of the second gate.

BRIEF DESCRIPTION OF THE DRAWINGS

FIG. 1 is a cross-sectional view illustrating the semiconductor device after forming a trench according to an embodiment;

FIG. 2 is a cross-sectional view illustrating the semiconductor device after forming a polysilicon layer in the trench according to an embodiment;

FIG. 3 is a cross-sectional view illustrating the semiconductor device after forming a first gate oxide layer according to an embodiment;

FIG. 4 is a cross-sectional view illustrating the semiconductor device after forming a first epitaxial layer on the first gate oxide layer according to an embodiment;

FIG. 5 is a cross-sectional view schematically illustrating a process of implanting ions into regions beside the first gate according to an embodiment;

FIG. 6 is a cross-sectional view illustrating the semiconductor device after forming an insulating layer according to an embodiment;

FIG. 7 is a cross-sectional view illustrating the semiconductor device after forming the second gate on the first gate oxide layer according to an embodiment; and FIG. 8 is a cross-sectional view schematically illustrating a process of implanting ions into regions beside the second gate according to an embodiment.

DETAILED DESCRIPTION

Hereinafter, embodiments of a semiconductor device and a manufacturing method of the same will be described in detail with reference to the accompanying drawings.

For convenience of description, the manufacturing method of the semiconductor device will be described together with the structure thereof.

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
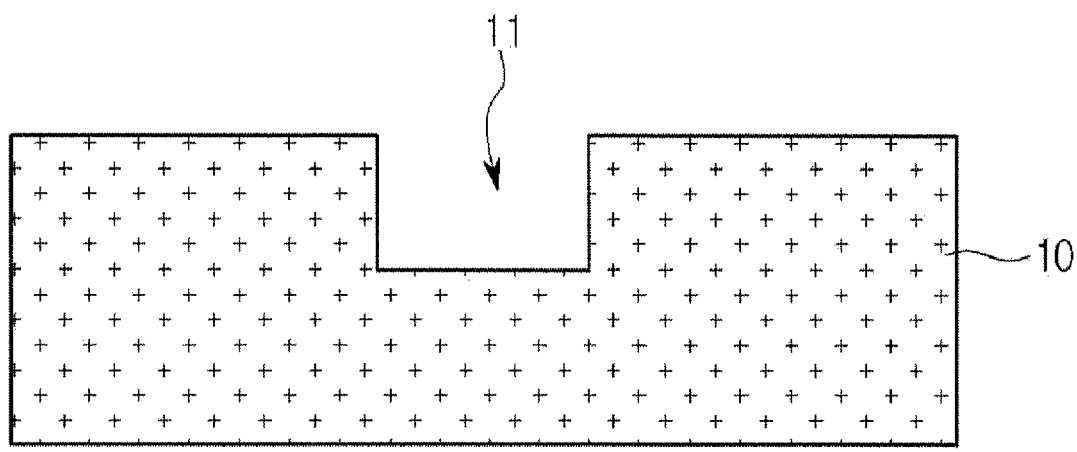
FIGS. 1-8 illustrate a method of manufacturing a semiconductor device according to an embodiment of the present invention.

Referring to FIG. 1, a trench 11 can be formed in a substrate 10. In an embodiment, photolithography and etching processes can be utilized to form the trench 11. In one embodiment, the substrate 10 can be a single crystal silicon substrate.

Figure 2:
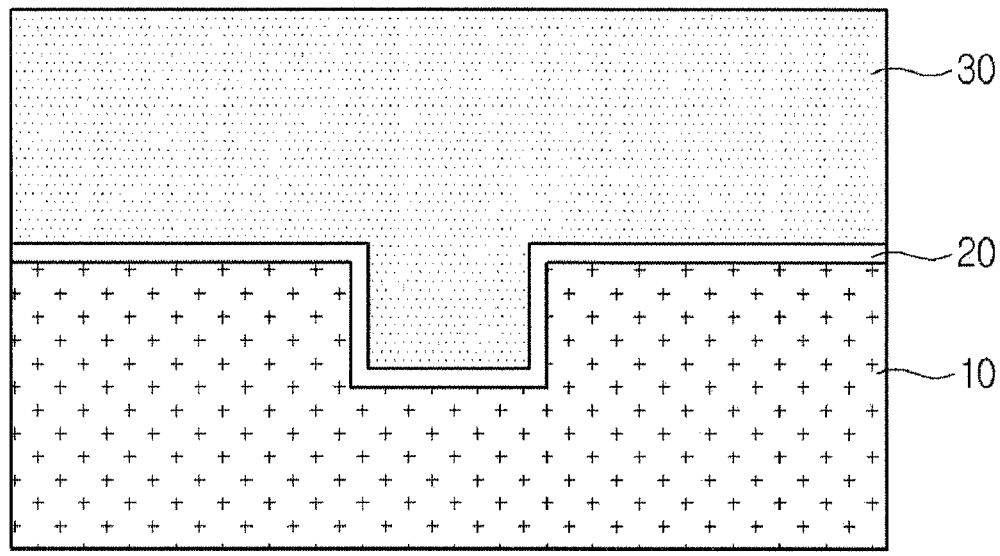

Then, referring to FIG. 2, a gate oxide can be grown on the entire surface of the substrate 10 including the trench 11 to form an oxide layer 20. A polysilicon layer 30 can be formed on the oxide layer 20 and filling the trench 11.

Although not shown in the drawings, an isolation layer can be formed to define an active area of the substrate, and to obtain electrical isolation between regions.

The isolation layer can be prepared in the form of an insulating layer such as an oxide layer on a field area of the substrate through an isolation process, such as an STI (shallow trench isolation) process. Accordingly, in certain embodiments, isolation layers can be provided in the substrate 10.

In further embodiments, after forming the isolation layer, implantation processes can be performed. The implantation processes can include, but are not limited to, ion implantation for adjusting threshold voltage $V_T$, ion implantation for preventing punch through, ion implantation for forming a channel stopper, and ion implantation for forming a well can be additionally performed. One or more of these implantation processes can be performed before forming the gate oxide layer 20 and the polysilicon layer 30.

Figure 3:
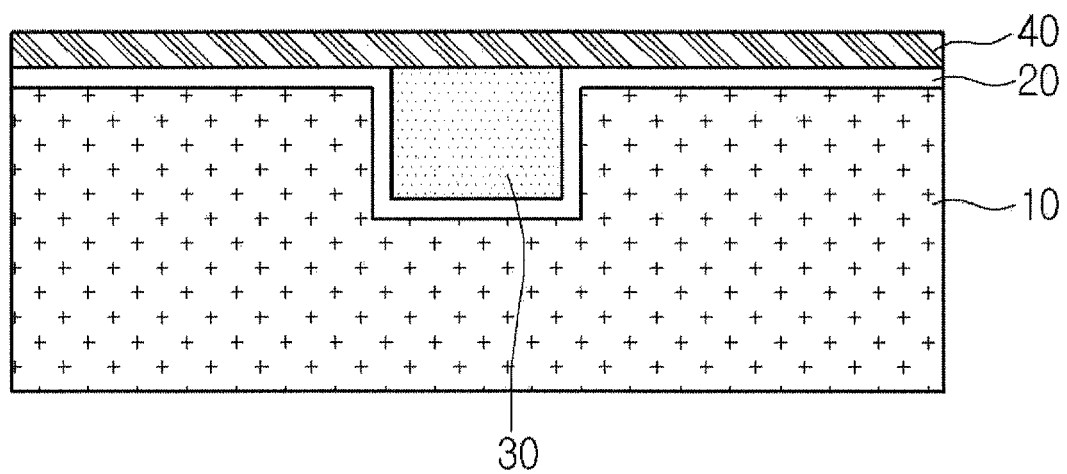

Referring to FIG. 3, the polysilicon layer 30 can be planarized such that the surface of the oxide layer 20 is exposed.

The polysilicon layer 30 can be planarized through a polishing process such as CMP (chemical mechanical polishing), an etchback process and the like.

Thus, as shown in FIG. 3, the polysilicon layer 30 can remain on the oxide layer 20 in the trench 11 to provide a first gate.

Hereinafter, the buried type polysilicon layer 30 will be referred to as the first gate.

After forming the first gate 30, a gate oxide can be grown on the first gate 30 to form a first gate oxide layer 40.

Figure 4:
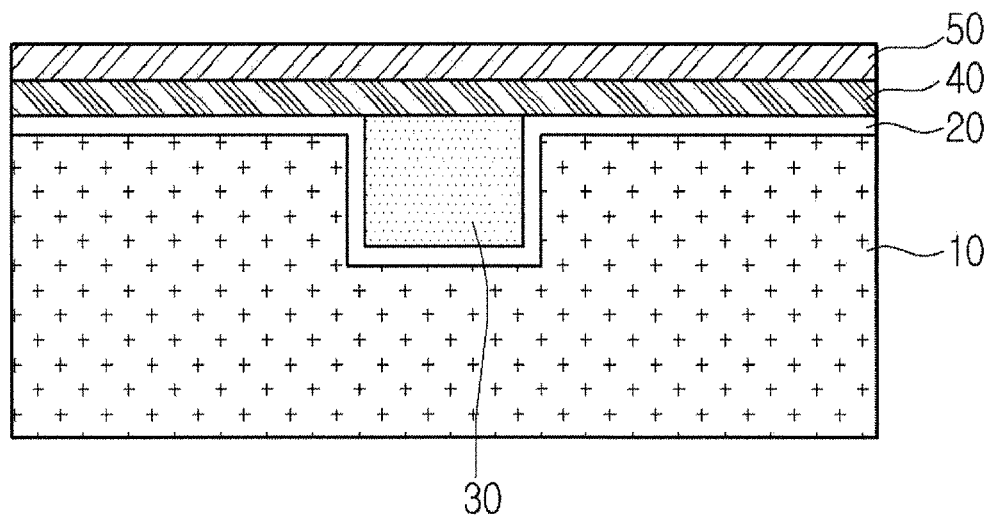

Referring to FIG. 4, a first epitaxial layer 50 can be formed on the first gate oxide layer 40. The first epitaxial layer 50 can be doped with N-type or P-type impurities to provide a well region.

Figure 5:
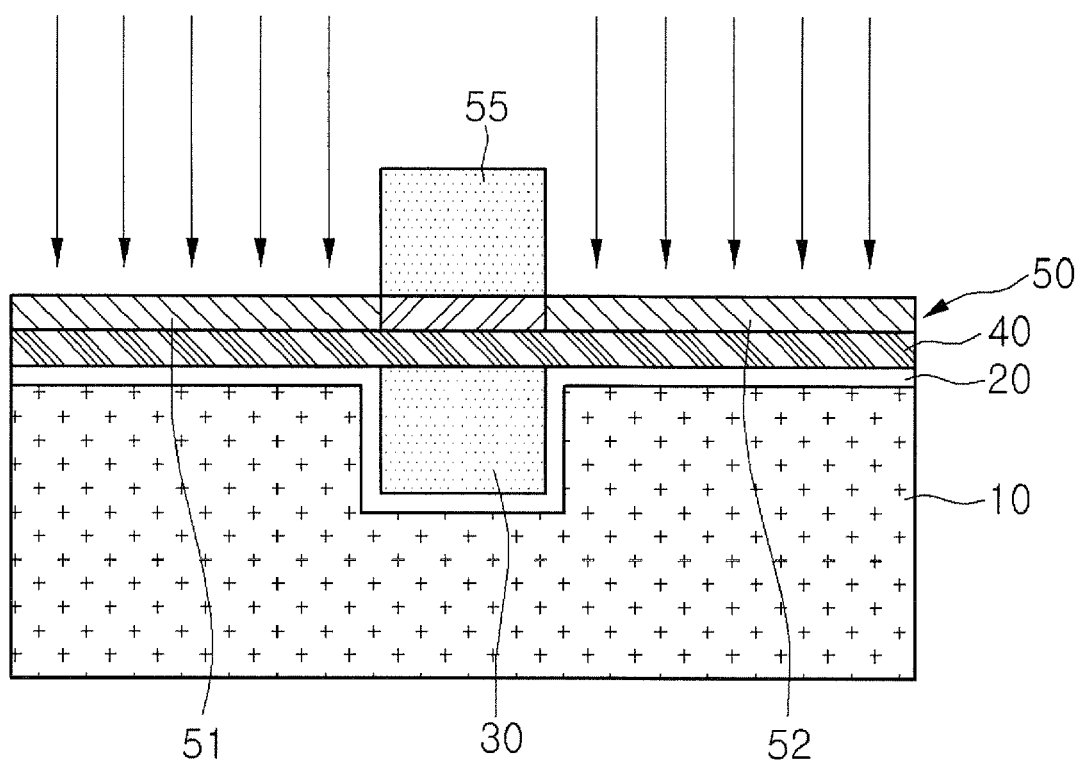

Then, as shown in FIG. 5, a photoresist pattern 55 can be formed on the first epitaxial layer 50 through development and exposure processes of a photoresist layer. The photoresist pattern 55 is used as an ion implantation mask and can have a size corresponding to the first gate 30. Further, the photoresist pattern 55 can be positioned corresponding to the first gate 30.

Thereafter, in one embodiment, P-type impurities (e.g. boron ions) can be implanted into the first epitaxial layer 50 with an ion implantation energy of 3 KeV to 20 KeV and dose of $1 \times 10^{15}$ ions/cm$^2$ to $5 \times 10^{15}$ ions/cm$^2$ to form a first source region 51 and first drain region 52 in the first epitaxial layer 50. The first source region 51 and the first drain region 52 can be provided in the first epitaxial layer 50 at sides of the first gate 30. The depth of the first source region 51 and the first drain region 52 can be controlled by the implantation energy.

In such a case, a PMOS transistor can be formed. In the case of forming the first source and drain regions 51, 52 of an NMOS transistor, N-type ions such as arsenic ions can be implanted into the first epitaxial layer 50.

Figure 6:
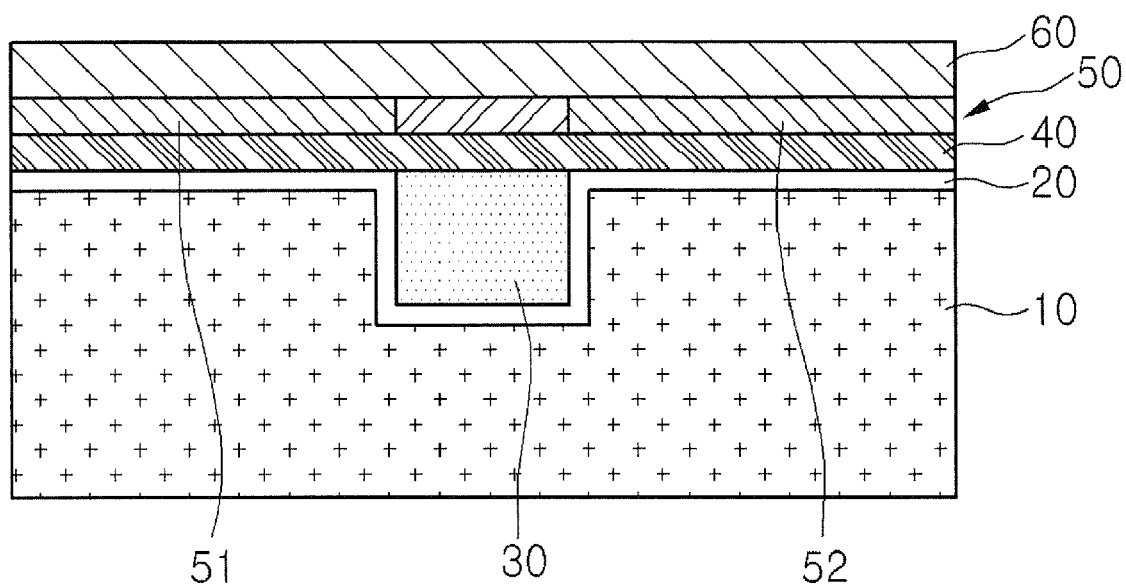

Then, referring to FIG. 6, after forming the first source and drain regions 51, 52 at sides of the first gate 30, an insulating layer 60 can be formed on the first epitaxial layer 50. The insulating layer 60 can be, for example, an oxide layer.

A part below the insulating layer 60 may be referred to as a first semiconductor device region and a part above the insulating layer 60 may be referred to as a second semiconductor device region.

In detail, the semiconductor device according to an embodiment includes two transistors having a vertical structure in which the buried-type first gate 30 and a protruding-type second gate 90 (see FIG. 7) are vertically arranged.

Figure 7:
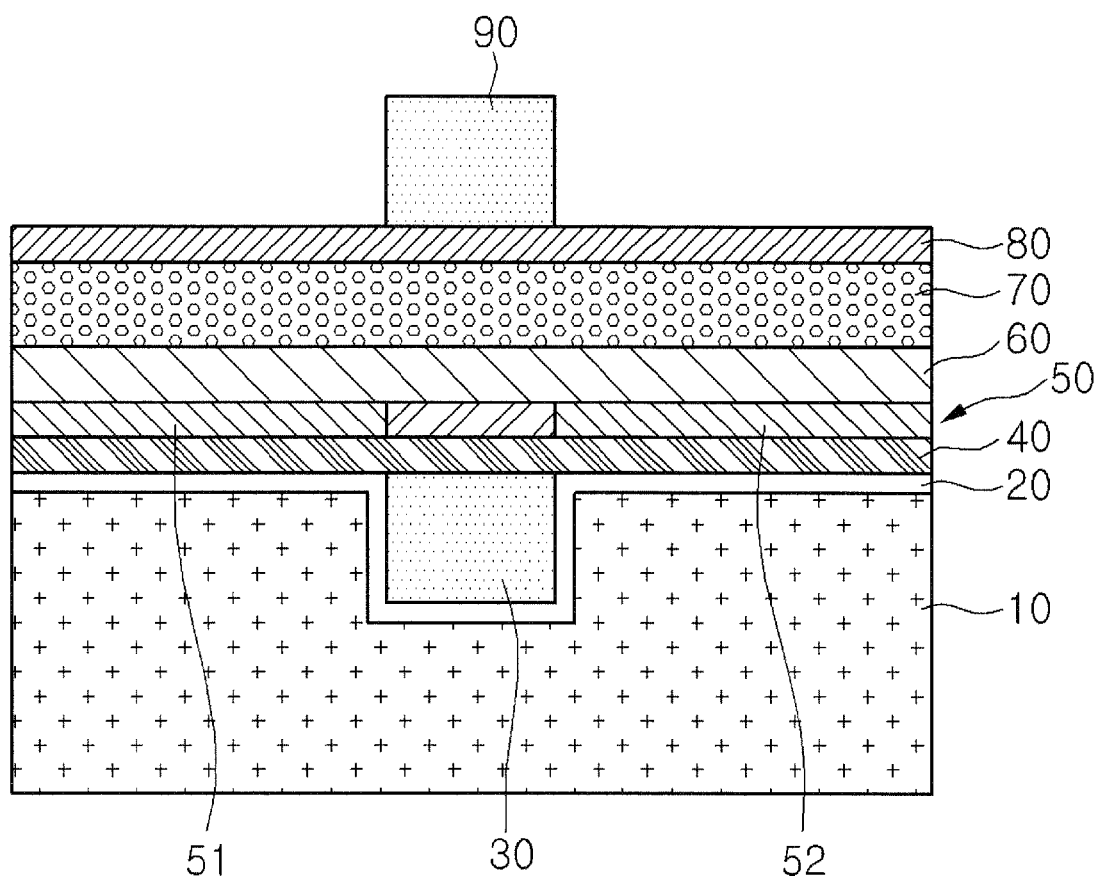

Referring to FIG. 7, a second epitaxial layer 70, in which source and drain regions of the second transistor are to be formed, can be formed on the insulating layer 60, and then a second gate oxide layer 80 can be formed.

Next, a polysilicon layer can be formed on the second gate oxide layer 80 and then etched through a photoresist process, so that the second gate 90 is formed.

The second gate 90 is preferably aligned corresponding to the first gate 30.

Figure 8:
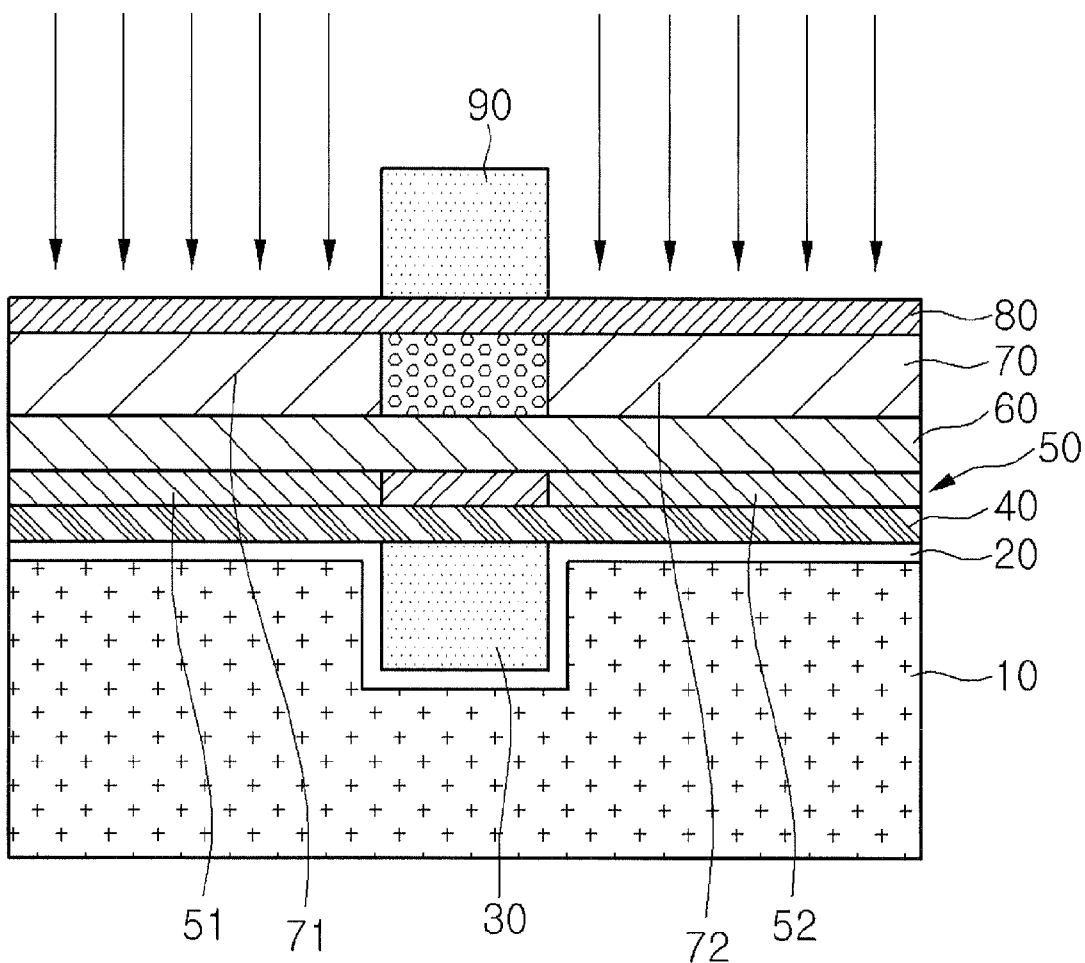

Then, as shown in FIG. 8, N-type or P-type ions can be implanted using the second gate 90 as an ion implantation mask to form a second source region 71 and a second drain region 72 for the second gate 90.

Thus, the second source region 71 and the second drain region 72 are formed in the second epitaxial layer 70 at sides of the second gate 90.

A semiconductor device according to an embodiment of the invention has a dual gate structure. According to such a structure, a short channel can be fundamentally prevented from being generated, so that hot carrier phenomenon can be inhibited, breakdown voltage can be efficiently controlled and a channel can be stably formed.

Next, according to the dual gate structure, since the semiconductor device can be formed with a vertical structure, the integration degree of the device can be improved.

Then, since an ion implantation process for forming an LDD region is not required, defects can be inhibited from occurring on the substrate and the semiconductor layer. Further, the manufacturing process can be simplified and the manufacturing time and cost can be saved.

Last, since an ion implantation apparatus is not required, a work manager can reduce their exposure to poison gas and high voltage.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, comprising:

forming a trench in a semiconductor substrate;

forming a first gate in the trench;

forming a first gate oxide layer on the semiconductor substrate including the first gate;
forming a first epitaxial layer on the first gate oxide layer;
forming first source and drain regions in the first epitaxial layer at sides of the first gate;
forming an insulating layer on the first epitaxial layer;
forming a second epitaxial layer on the insulating layer;
forming a second gate oxide layer on the second epitaxial layer;
forming a second gate on the second gate oxide layer; and
forming second source and drain regions in the second epitaxial layer at sides of the second gate.

2. The method according to claim 1, further comprising forming an oxide layer on the semiconductor substrate including the trench before forming the first gate.

3. The method according to claim 2, wherein forming the first gate comprises:
forming a polysilicon layer on the oxide layer including filling the trench; and
planarizing the polysilicon layer such that a surface of the oxide layer is exposed.

4. The method according to claim 3, wherein the first gate oxide layer is formed on the first gate and the oxide layer exposed by the planarizing of the polysilicon layer.

5. The method according to claim 1, further comprising forming a well region in the first epitaxial layer before forming the first source and drain regions.

6. The method according to claim 1, wherein forming the first source and drain regions comprises:
forming a photoresist pattern on the first epitaxial layer corresponding to the position of the first gate;
implanting ions by using the photoresist pattern as a mask, thereby forming the first source and drain regions; and
removing the photoresist pattern.

7. The method according to claim 1, wherein forming the second gate comprises:
forming a polysilicon layer on the second gate oxide layer; and
etching the polysilicon layer through photolithography and etch processes.

8. The method according to claim 1, wherein forming the second source and drain regions comprises implanting ions into the second epitaxial layer using the second gate as a mask.

9. The method according to claim 1, wherein the first and second gates are formed corresponding to each other in alignment when viewed in a plan view.

10. The method according to claim 1, wherein layers above the insulating layer correspond to a first transistor region and layers below the insulating layer correspond to a second transistor region.

11. The method according to claim 1, wherein the first and second gates are formed to have similar size and shape.

\* \* \* \* \*